United States Patent [19]
Gillig

[11] Patent Number: 5,392,000
[45] Date of Patent: Feb. 21, 1995

[54] APPARATUS AND METHOD FOR FREQUENCY COMPENSATING AN OPERATIONAL AMPLIFIER

[75] Inventor: Steven F. Gillig, Roselle, Ill.

[73] Assignee: Motorola, Inc., Schaumburg, Ill.

[21] Appl. No.: 149,683

[22] Filed: Nov. 9, 1993

[51] Int. Cl.⁶ .............................................. H03F 1/34
[52] U.S. Cl. ..................................... 330/107; 330/292
[58] Field of Search ................ 330/107, 109, 290, 292, 330/294, 302, 311

[56] References Cited

U.S. PATENT DOCUMENTS

| | | | |
|---|---|---|---|
| 4,415,868 | 11/1983 | Gross | 330/107 X |
| 5,023,564 | 6/1991 | Jobling | 330/107 |
| 5,128,630 | 7/1992 | Mijuskovic | 330/253 |

*Primary Examiner*—Steven Mottola
*Attorney, Agent, or Firm*—Kevin D. Kaschke; F. John Motsinger

[57] ABSTRACT

A transimpedance circuit (201), and method therefor, frequency compensates an operational amplifier. The transimpedance circuit (201) has an input terminal (205) coupled to receive an amplified signal (205) and an ouput terminal (206) operative to produce a buffered amplified signal. The input terminal (205) of the transimpedance circuit (201) presents a resistive input impedance to the amplified signal at a frequency substantially near an open loop unity gain frequency of the operational amplifier (200). The amplified signal is buffered from a complex impedance of an input terminal (206) of an output driver (103). The present invention advantageously provides wide bandwidth and stable operation with loads having low complex impedance.

18 Claims, 4 Drawing Sheets

—PRIOR ART—

200

400

200

5,392,000

APPARATUS AND METHOD FOR FREQUENCY COMPENSATING AN OPERATIONAL AMPLIFIER

FIELD OF THE INVENTION

The present invention relates generally to operational amplifiers and, more particularly, to an apparatus and method for frequency compensating an operational amplifier.

BACKGROUND OF THE INVENTION

FIG. 1 illustrates, by example, a block diagram of a conventional operational amplifier 100 (hereinafter referred to as "amplifier") and a load 110. The amplifier 100 is a basic analog building block for may types of analog signal processing applications. These applications may include active filtering, signal amplification, and voltage regulation to name a few.

The amplifier 100 of FIG. 1 generally includes a transconductance stage 101, a compensation network 102 and an output driver 103. FIG. 1 also illustrates an output load 110.

The interconnection of the blocks of the amplifier 100 and operation thereof is described as follows. The transconductance stage 101 is coupled to receive input signal 105 and input signal 106 and operative to produce an amplified signal at line 107. The compensation network 102 is operative to frequency compensate the amplified signal at line 107. The compensation network 102 may optionally be coupled to receive an output signal at line 109. The output driver 103 is coupled to receive amplified signal 107 and operative to produce output signal 108 to drive the output load 110.

The operation of the amplifier 100 is described as follows. A differential input signal between input 105 and input 106 is amplified in transconductance stage 101 and converted to a current signal at line 107. The compensation network 102 provides frequency compensation of the amplified current at line 107 by converting the current signal to a voltage signal by way of the impedance it provides at line 107. The output driver 103 provides voltage and/or current gain to the amplified signal at line 107 and produces the output signal 108 which appears across the load 110. The load 110 may have a complex as well as a real impedance associated with it.

Amplifiers may be configured as open or closed loops. Amplifiers have gain defined by the relationship between the amplifier's input and output. The gain has frequency dependent amplitude and phase. In order for the amplifier to be unconditionally stable in a closed loop configuration, the amplitude of the open loop gain versus frequency must drop below unity before the open loop phase exceeds 180 degrees. Phase margin is defined as 180 degrees minus the open loop phase at the frequency at which the amplitude of the open loop gain drops below unity. A phase margin of 45 degrees is usually considered adequate. It is often desirable for the phase margin to be at least 45 degrees over a wide range of load impedance's.

A problem with the conventional amplifier 100 is that the output driver 103 may be a physically large device with associated large input capacitance. The large input capacitance appears in parallel with the compensation network 102 and can severely alter its desired frequency compensation characteristic.

Another problem with the conventional amplifier 100 is that in some applications, such as voltage regulators, the complex impedance associated with the output load may be significant. This complex impedance may add additional phase shift to the open loop gain and degrade the phase margin of the amplifier. If the performance of the compensation network 102 is severely altered by the output driver's input capacitance, then the range of values for acceptable load impedances may have to be severely restricted in order to guarantee sufficient phase margin for stable operation.

A solution to these problems involves reducing the bandwidth of the amplifier by reducing its unity gain open loop frequency. However, a disadvantage of this solution is that the amplifier 100 can't amplify high frequency signals because of the reduced bandwidth. Further, reducing the bandwidth may require physically large components such as capacitors. Still further, the amplifier 100 is susceptible to high frequency noise on the power supply or ground to the amplifier.

Accordingly there is a need for an apparatus and method for frequency compensating an operational amplifier advantageously providing wider bandwidth and improved stability with complex low impedance loads.

BRIEF DESCRIPTION OF THE DRAWINGS

FIG. I illustrates a block diagram of a conventional operational amplifier having a load.

DETAILED DESCRIPTION OF A PREFERRED EMBODIMENT

In accordance with the present invention, the foregoing need is substantially met by an improved apparatus and method for frequency compensating an operational amplifier. According to the present invention, a transimpedance circuit has an input terminal coupled to receive an amplified signal and an output terminal operative to produce a buffered amplified signal. An input terminal of the transimpedance circuit presents a resistive input impedance to the amplified signal at a frequency substantially near an open loop unity gain frequency of the operational amplifier. The amplified signal is buffered from a complex impedance of an input terminal of an output driver. The present invention advantageously provides wide bandwidth and stable operation with loads having low complex impedance.

Figure 1:
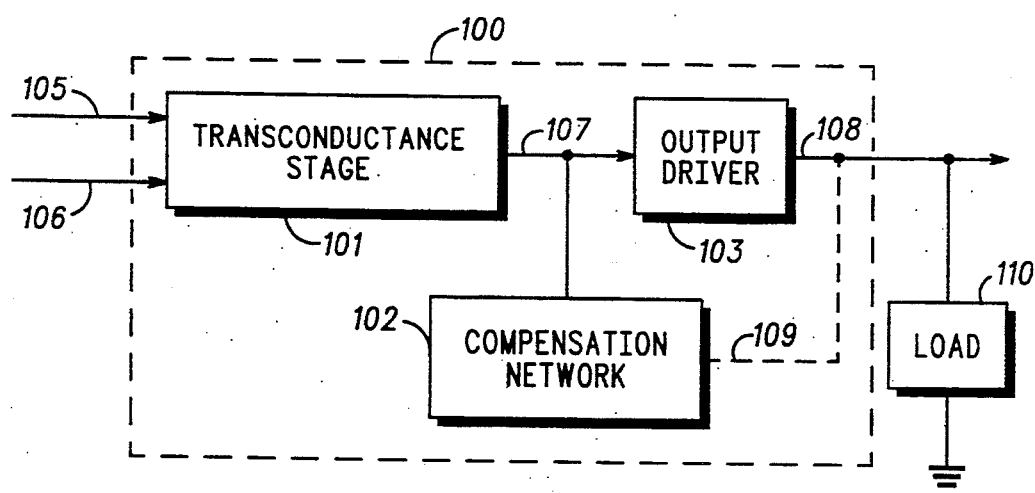
Figure 2:
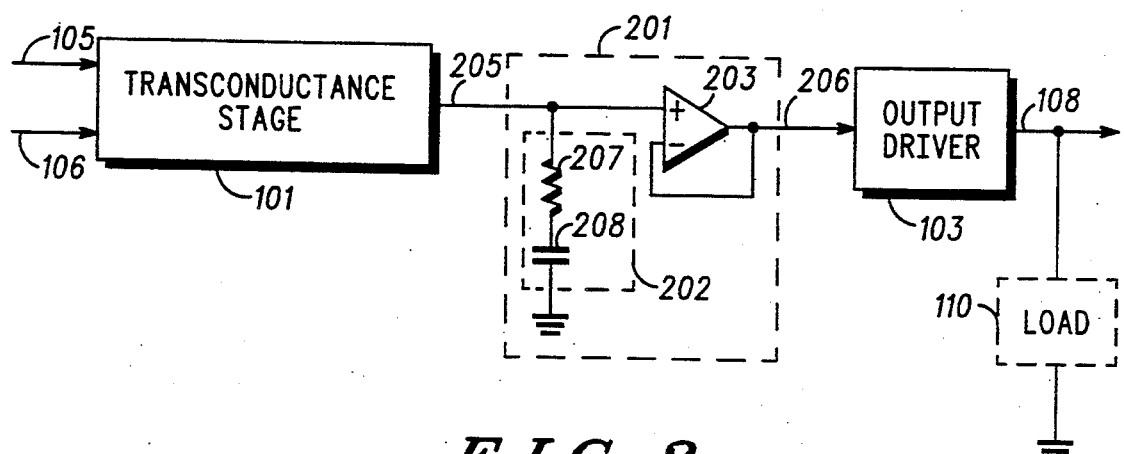
FIG. 2 illustrates a block diagram of an operational amplifier having a transimpedance circuit in accordance with the present invention.

The present invention can be more fully described with reference to FIGS. 2–5, wherein FIG. 2 illustrates a block diagram of an operational amplifier 200 having a transimpedance circuit in accordance with the present invention. The operational amplifier 200 generally includes a transconductance stage 101, a transimpedance circuit 201, and an output driver 103. Individually, the transconductance stage 101 and the output driver 103 are generally well known in the art; hence, no further discussion will be presented except to facilitate the understanding of the present invention. The transimpedance circuit 201 and its operation with the operational amplifier 200 is considered novel and will be described and illustrated in detail below with reference to FIGS. 2–5, in accordance with the present invention.

The transconductance stage 101 may be implemented, for example, using a single stage of a Signetics NE5517 dual operational transconductance amplifier. The output driver 103 may be implemented, for example, using a p-channel metal oxide semiconductor field effect transistor (p-channel MOSFET).

The operational amplifier 200 drives a load 110. The load 110 has a complex impedance having a value selected from a wide range of values. A load which has a complex impedance is not purely resistive but instead generally has a capacitive or inductive component. In the preferred embodiment, the load has a parallel capacitive component.

The operational amplifier 200 has an open loop unity gain frequency. The open loop unity gain frequency is defined as the frequency at which the gain of the operational amplifier 200 drops to unity, when operated in an open loop configuration. Open loop configuration means without feedback.

The transconductance stage 101 has input terminals 105 and 106 coupled to receive input signals and having an output terminal 205 operative to produce an amplified signal. Alternatively, terminal 205 may, for example, be a double-ended differential signal without changing the operation of the present invention. Furthermore, all signals within the operational amplifier 200 may, alternatively, be double-ended signals. The transconductance stage 101 is a circuit which produces a current at its output terminal 205 which is generally linearly related to the voltage at the input terminals 105 and 106. The gain of transconductance stage 101 is the ratio of the current at its output terminal 205 to the voltage at its input terminals 105 and 106.

The transimpedance circuit 201 has an input terminal 205 coupled to receive the amplified signal and an output terminal 206 operative to produce a buffered amplified signal. The input terminal 205 of the transimpedance circuit 201 presents a resistive input impedance to the amplified signal at a frequency substantially near an open loop unity gain frequency of the operational amplifier 200. The transimpedance circuit 201 receives a current at input terminal 205 and produces an output voltage at output terminal 206. The purpose of having the resistive input impedance to the amplified signal at a frequency substantially near an open loop unity gain frequency of the operational amplifier 200 is to eliminate a negative phase shift at input terminal 205 which would reduce the phase margin near the unity gain frequency.

The output driver 103 has an input terminal 206, having a complex impedance, coupled to receive the buffered amplified signal and having an output terminal 108 operative to produce an output signal to drive the load 110. The amplified signal at terminal 205 is buffered from the complex impedance of the input terminal 206 of the output driver 103. In the preferred embodiment, the output driver 103 is a PMOS FET and has a complex input impedance consisting of a large parallel input capacitance. The amplified signal at terminal 205 is buffered from the large input capacitance of output driver 103, which means that the amplified signal is not loaded by the large input capacitance of output driver 103.

The transimpedance circuit 201 generally includes a compensation network 202 and a buffer amplifier 203. Individually, the compensation network 202 and the buffer amplified 203 are generally well known in the art; hence, no further discussion will be presented except to facilitate the understanding of the present invention. The combination of the compensation network 202 and the buffer amplifier 203 and its use in the operational amplifier 200 is considered novel and will be described and illustrated in detail below with reference to FIGS. 2–5, in accordance with the present invention.

The compensation network 202 may be implemented, for example, using a resistor 207 and a capacitor 208 in accordance with well known design techniques. The buffer amplifier 203 may be implemented, for example, using an operational amplifier such as a Motorola MC1741.

According to the preferred embodiment of the present invention, as shown in FIG. 2, the buffer amplifier 203 has input terminal 205 of the transimpedance circuit 201 coupled to receive the amplified signal, and has the output terminal 206 of the transimpedance circuit 201 operative to produce the buffered amplified signal. The compensation network 202 has the input terminal of the transimpedance circuit 201 coupled to receive the amplified signal 205 and operative to frequency compensate the amplified signal 205. Frequency compensation of the amplified signal 205 refers to the modification of the amplitude and phase versus frequency of the amplified signal 205 to produce a desired amplitude and phase versus frequency in the overall open loop gain of amplifier 100. The desired open loop gain has a phase margin of generally at least 45 degrees.

Figure 3:
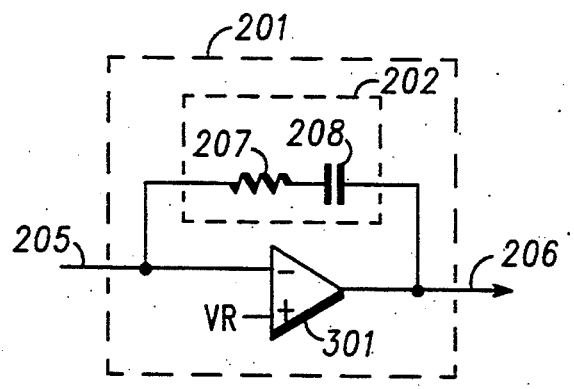
FIG. 3 illustrates a block diagram of a transimpedance circuit in accordance with an alternate embodiment of the present invention.

FIG. 3 illustrates a block diagram of a transimpedance circuit 201 in accordance with an alternate embodiment of the present invention. The transimpedance circuit 201, in accordance with the alternate embodiment, generally includes a feedback amplifier 301 and the compensation network 202. Individually the feedback amplifier 301 and the compensation network 202 are generally well known in the art; hence, no further discussion will be presented except to facilitate the understanding of the present invention. The combination of the feedback amplifier 301 and the compensation network 202 and their use in the operational amplifier 200 of FIG. 2 is considered novel and will be described and illustrated in detail below with reference to FIGS. 3–5, in accordance with the alternate embodiment of the present invention.

The feedback amplifier 301 may be implemented, for example, using an operational amplifier such as a Motorola MC1741.

The feedback amplifier 301 has input terminal 205 of the transimpedance circuit 201 coupled to receive the amplified signal, and has the output terminal 206 of the transimpedance circuit 201 operative to produce the buffered amplified signal. A feedback configuration is a method for coupling the output of an amplifier to its input. An advantage of a feedback configuration is the low output impedance which it produces.

The compensation network 202 is coupled between the input terminal 205 of the transimpedance circuit 201 and the output terminal 206 of the transimpedance circuit 201, and operative to frequency compensate the amplified signal at the input terminal 205 responsive to the buffered amplified signal at the output terminal 206. The compensation network 202 is placed in the feedback path of the feedback amplifier 301 to provide a current to voltage conversion function. The input to the feedback amplifier 301 acts as a virtual ground so that no voltage appears at its input. No current flows into the input of the feedback amplifier 301. All of the current flows into the compensation network 202. The output of the feedback amplifier 301 has a low impedance because of the feedback action.

Figure 4:
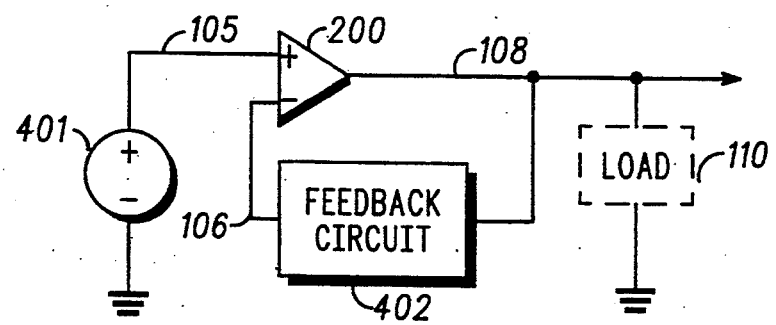
FIG. 4 illustrates a block diagram of a voltage regulator including the operational amplifier of FIG. 2 in accordance with the present invention.

FIG. 4 illustrates a block diagram of a voltage regulator 400 including the operational amplifier 200 of FIG. 2 in accordance with the present invention. The voltage regulator 400 generally includes the operational amplifier 200 and a feedback circuit 402. The feedback circuit 402 is generally well known in the art; hence, no further discussion will be presented except to facilitate the understanding of the present invention. The feedback circuit may be implemented, for example, with resistors as is well known in the art.

The operational amplifier 200 is coupled to receive an input signal at terminal 105 from a voltage reference signal source 401, and operative to produce an output signal at terminal 108 having a regulated voltage to drive the load 110. The feedback circuit 402 is coupled between the input terminal 106 of the operational amplifier 200 and the output terminal 108 of the operational amplifier 200.

The advantages of using the operational amplifier 200 in the voltage regulator 400 is that the voltage regulator 400 can be provided with wider bandwidth, for improved power supply rejection, and improved stability with complex low impedance loads.

Figure 5:
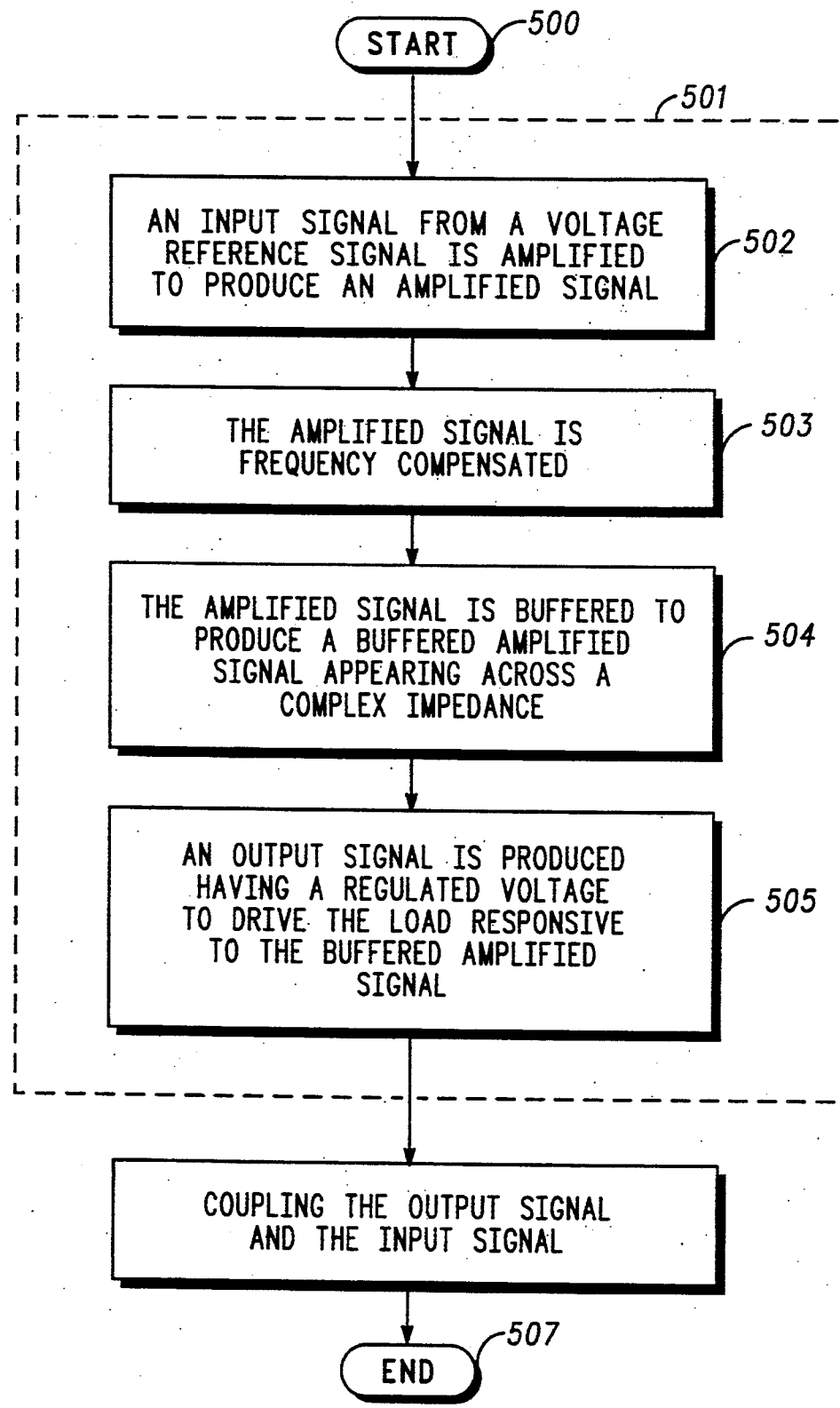
FIG. 5 illustrates a flow chart illustrating the steps for frequency compensating the operational amplifier 200 of FIG. 2 and the voltage regulator 400 of FIG. 4 in accordance with the present invention.

FIG. 5 illustrates a flow chart illustrating the steps for frequency compensating the operational amplifier 200 of FIG. 2 and the voltage regulator 400 of FIG. 4. Generally, steps 501–506 describe the operation of the voltage regulator 400 of FIG. 4. Generally, steps 502–505 describe the operation of the operational amplifier 200 of FIG. 2. Generally, steps 503 and 504 describe the method of frequency compensating the operational amplifier 200 of FIG. 2.

The flowchart begins at step 500.

At step 502, an input signal 105 from the voltage reference signal source 401 is amplified to produce an amplified signal 205.

At step 503, the amplified signal 205 is frequency compensated. Frequency compensating presents a resistive input impedance to the amplified signal 205 near the unity gain frequency of the operational amplifier 200.

At step 504, the amplified signal 205 is buffered to produce a buffered amplified signal 206 appearing across a complex impedance.

At step 505, an output signal 108 is produced having a regulated voltage to drive the load 110 responsive to the buffered amplified signal 206.

At step 506, the output signal 108 is coupled to the input signal 106.

The flowchart ends at step 507.

Figure 6:
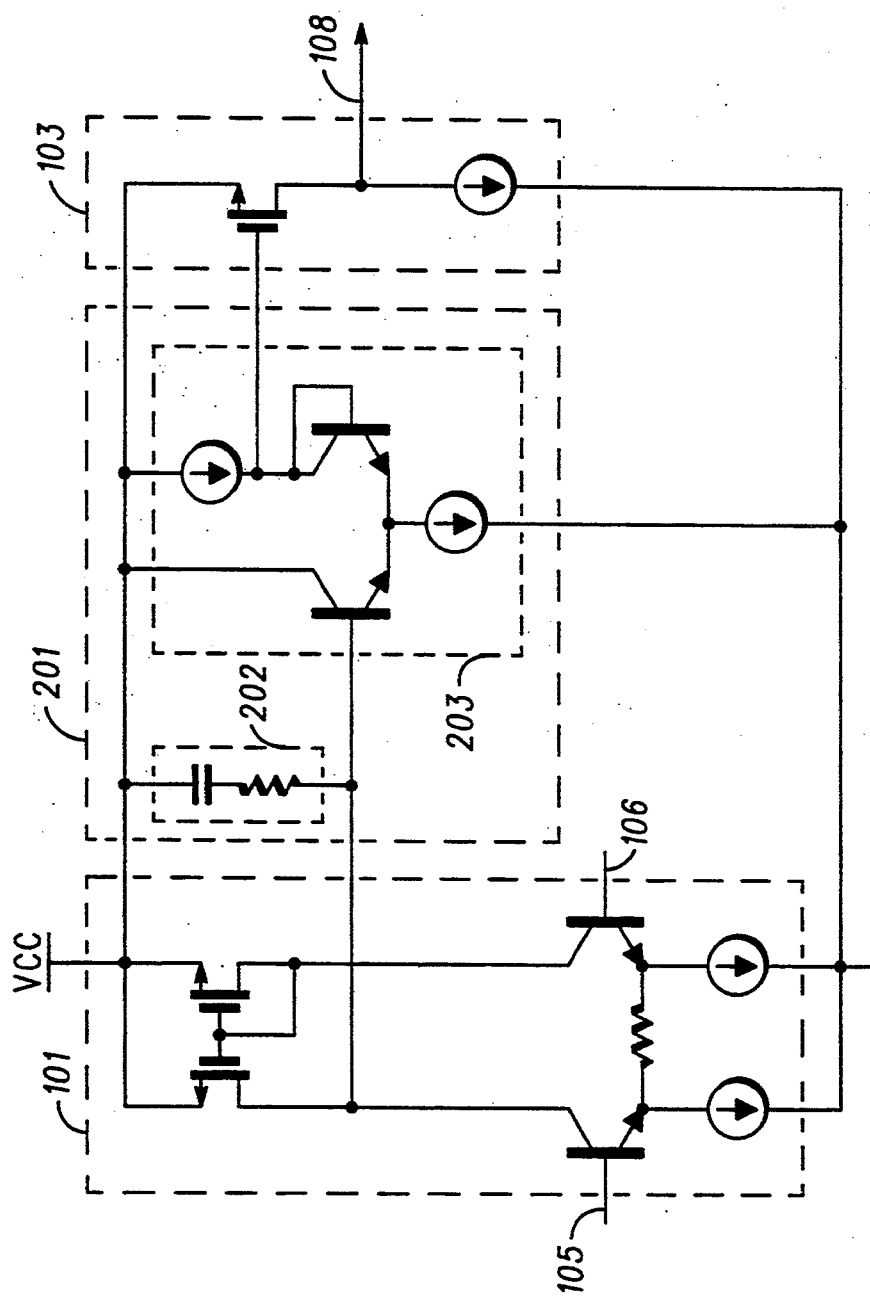
FIG. 6 illustrates a schematic diagram of the operational amplifier 200 of FIG. 2 in accordance with the present invention.

FIG. 6 illustrates a schematic diagram of the operational amplifier 200 of FIG. 2 in accordance with the present invention. The transconductance stage 101, the transimpedance circuit 201, the output driver 103, the buffer amplifier 203, and the frequency compensation network 202 are outlined in hatch and correspond to the reference numerals for the blocks in FIG. 2. The schematic of the operational amplifier 200, as shown in FIG. 6, is implemented using conventional components using bipolar devices, metal oxide semiconductor field effect transistors (MOSFET), capacitors, resistors, and current sources. The current sources are also implemented using bipolar and MOSFET devices; however, the current sources are shown in FIG. 6 as ideal for the sake of simplicity.

Thus, the present invention advantageously provides an apparatus and method for frequency compensating an operational amplifier 200. According to the present invention, a transimpedance circuit has at least one input terminal coupled to receive at least one amplified signal and at least one output terminal operative to produce at least one buffered amplified signal. The at least one input terminal of the transimpedance circuit presents a resistive input impedance to the at least one amplified signal. The at least one amplified signal has a frequency substantially near an open loop unity gain frequency of the operational amplifier. The at least one amplified signal is buffered from a complex impedance of the at least one input terminal of an output driver. The present invention advantageously provides wide bandwidth and stable operation with loads having low complex impedance. With the present invention, the problems of low bandwidth and unstable operation with low complex impedance loads of the prior art are substantially resolved.

While the present invention has been described with reference to illustrative embodiments thereof, it is not intended that the invention be limited to these specific embodiments. Those skilled in the art will recognize that variations and modifications can be made without departing from the spirit and scope of the present invention as set forth in the appended claims.

What is claimed is:

1. In an operational amplifier that drives a load having a complex impedance having a value selected from a wide range of values, wherein the operational amplifier has an open loop unity gain frequency, wherein a transconductance stage has at least one input terminal coupled to receive at least one input signal and has at least one output terminal operative to produce at least one amplified signal, wherein an output driver has at least one input terminal coupled to receive at least one buffered amplified signal and has at least one output terminal operative to produce an output signal to drive the load, an apparatus for frequency compensating the operational amplifier comprising:

a transimpedance circuit having at least one input terminal coupled to receive the at least one amplified signal and at least one output terminal operative to produce the at least one buffered amplified signal, wherein the transimpedance circuit has a transfer function represented by the voltage of the at least one buffered amplified signal divided by the current of the at least one amplified signal, and wherein the transfer function has a zero at a frequency substantially near the open loop unity gain frequency, and wherein the at least one amplified signal is buffered from a complex impedance of the at least one input terminal of the output driver.

2. An apparatus according to claim 1 wherein the transimpedance circuit further comprises:

a buffer amplifier having the at least one input terminal of the transimpedance circuit coupled to receive the at least amplified signal and having the at least one output terminal of the transimpedance circuit operative to produce the at least one buffered amplified signal; and a compensation network having the at least one input terminal of the transimpedance circuit coupled to receive the at least one amplified signal and operative to frequency compensate the at least one amplified signal.

3. An apparatus according to claim 1 wherein the transimpedance circuit further comprises:

a feedback amplifier having the at least one input terminal of the transimpedance circuit coupled to receive the at least one amplified signal and having the at least one output terminal of the transimpedance circuit operative to produce the at least one buffered amplified signal; and a compensation network coupled between the at least one input terminal of the transimpedance circuit and at least one output terminal of the transimpedance circuit, and operative to frequency compensate the at least one amplified signal responsive to the at least one buffered amplified signal.

4. In an operational amplifier that drives a load having a complex impedance having a value selected from a wide range of values, wherein the operational amplifier has an open loop unity gain frequency, wherein at least one input signal is amplified to produce at least one amplified signal, wherein an output signal is produced to drive the load responsive to at least one buffered amplified signal, a method for frequency compensating the operational amplifier comprising the steps of:

frequency compensating the at least one amplified signal; and buffering the at least one amplified signal to produce the at least one buffered amplified signal;

wherein the steps of frequency compensating and buffering produce a transfer function represented by the voltage of the at least one buffered amplified signal divided by the current of the at least one amplified signal, wherein the transfer function has a zero at a frequency substantially near the open loop unity gain frequency.

5. An operational amplifier for driving a load having a complex impedance having a value selected from a wide range of values, wherein the operational amplifier has an open loop unity gain frequency, the operational amplifier comprising:

a transconductance stage having at least one input terminal coupled to receive at least one input signal and having at least one output terminal operative to produce at least one amplified signal;

a transimpedance circuit having at least one input terminal coupled to receive the at least one amplified signal and at least one output terminal operative to produce at least one buffered amplified signal, wherein the transimpedance circuit has a transfer function represented by the voltage of the at least one buffered amplified signal divided by the current of the at least one amplified signal, and wherein the transfer function has a zero at a frequency substantially near the open loop unity gain frequency; and an output driver having at least one input terminal, having a complex impedance, coupled to receive the at least one buffered amplified signal and having at least one output terminal operative to produce an output signal to drive the load, wherein the at least one amplified signal is buffered from the complex impedance of the at least one input terminal of the output driver.

6. An operational amplifier according to claim 5 wherein the transimpedance circuit further comprises:

a buffer amplifier having the at least one input terminal of the transimpedance circuit coupled to receive the at least amplified signal and having the at least one output terminal of the transimpedance circuit operative to produce the at least one buffered amplified signal; and a compensation network having the at least one input terminal of the transimpedance circuit coupled to receive the at least one amplified signal and operative to frequency compensate the at least one amplified signal.

7. An operational amplifier according to claim 5 wherein the transimpedance circuit further comprises:

a feedback amplifier having the at least one input terminal of the transimpedance circuit coupled to receive the at least one amplified signal and having the at least one output terminal of the transimpedance circuit operative to produce the at least one buffered amplified signal; and a compensation network coupled between the at least one input terminal of the transimpedance circuit and at least one output terminal of the transimpedance circuit, and operative to frequency compensate the at least one amplified signal responsive to the at least one buffered amplified signal.

8. A voltage regulator for driving a load having a complex impedance having a value selected from a wide range of values, the voltage regulator comprising:

an operational amplifier having at least one input terminal and at least one output terminal, and having an open loop unity gain frequency, the operational amplifier comprising:

a transconductance stage having the at least one input terminal of the operational amplifier coupled to receive at least one input signal from a voltage reference signal source and having at least one output terminal operative to produce at least one amplified signal;

a transimpedance circuit having at least one input terminal coupled to receive the at least one amplified signal and at least one output terminal operative to produce at least one buffered amplified signal, wherein the transimpedance circuit has a transfer function represented by the voltage of the at least one buffered amplified signal divided by the current of the at least one amplified signal, wherein the transfer function has a zero at a frequency substantially near the open loop unity gain frequency; and an output driver having at least one input terminal, having a complex impedance, coupled to receive the at least one buffered amplified signal and having the at least one output terminal of the operational amplifier operative to produce an output signal having a regulated voltage to drive the load, wherein the at least one amplified signal is buffered from the complex impedance of the at least one input terminal of the output driver; and a feedback circuit coupled between the at least one input terminal of the operational amplifier and the at least one output terminal of the operational amplifier.

9. A voltage regulator according to claim 8 wherein the transimpedance circuit further comprises:

a buffer amplifier having the at least one input terminal of the transimpedance circuit coupled to receive the at least amplified signal and having the at least one output terminal of the transimpedance circuit operative to produce the at least one buffered amplified signal; and a compensation network having the at least one input terminal of the transimpedance circuit coupled to receive the at least one amplified signal and operative to frequency compensate the at least one amplified signal.

10. A voltage regulator according to claim 8 wherein the transimpedance circuit further comprises:

a feedback amplifier having the at least one input terminal of the transimpedance circuit coupled to receive the at least one amplified signal and having the at least one output terminal of the transimpedance circuit operative to produce the at least one buffered amplified signal; and a compensation network coupled between the at least one input terminal of the transimpedance circuit and at least one output terminal of the transimpedance circuit, and operative to frequency compensate the at least one amplified signal responsive to the at least one buffered amplified signal.

11. A method for operating an operational amplifier that drives a load having a complex impedance having a value selected from a wide range of values, wherein the operational amplifier has an open loop unity gain frequency, the method for operating the operational amplifier comprising the steps of:

amplifying at least one input signal to produce at least one amplified signal;

frequency compensating the at least one amplified signal;

buffering the at least one amplified signal to produce at least one buffered amplified signal, wherein the steps of frequency compensating and buffering produce a transfer function represented by the voltage of the at least one buffered amplified signal divided by the current of the at least one amplified signal, wherein the transfer function has a zero at a frequency substantially near the open loop unity gain frequency; and producing an output signal to drive the load responsive to the at least one buffered amplified signal.

12. A method for operating a voltage regulator for driving a load having a complex impedance having a value selected from a wide range of values, the method for operating the voltage regulator comprising the steps of:

operating an operational amplifier having an open loop unity gain frequency, the method for operating the operational amplifier comprising the steps of:

amplifying at least one input signal to produce at least one amplified signal;

frequency compensating the at least one amplified signal;

buffering the at least one amplified signal to produce at least one buffered amplified signal, wherein the steps of frequency compensating and buffering produce a transfer function represented by the voltage of the at least one buffered amplified signal divided by the current of the at least one amplified signal, wherein the transfer function has a zero at a frequency substantially near the open loop unity gain frequency; and producing an output signal to drive the load responsive to the at least one buffered amplified signal; and coupling the at least one output signal and the at least one input signal.

13. An apparatus according to claim 2 wherein the compensation network further comprises:

at least one resistor; and at least one capacitor coupled to the at least one resistor in a series arrangement.

14. An apparatus according to claim 3 wherein the compensation network further comprises:

at least one resistor; and at least one capacitor coupled to the at least one resistor in a series arrangement.

15. An apparatus according to claim 6 wherein the compensation network further comprises:

at least one resistor; and at least one capacitor coupled to the at least one resistor in a series arrangement.

16. An apparatus according to claim 7 wherein the compensation network further comprises:

at least one resistor; and at least one capacitor coupled to the at least one resistor in a series arrangement.

17. An apparatus according to claim 9 wherein the compensation network further comprises:

at least one resistor; and at least one capacitor coupled to the at least one resistor in a series arrangement.

18. An apparatus according to claim 10 wherein the compensation network further comprises:

at least one resistor; and at least one capacitor coupled to the at least one resistor in a series arrangement.

* * * * *